(12) United States Patent
Plotnikov et al.

(10) Patent No.: US 6,970,112 B2
(45) Date of Patent: Nov. 29, 2005

(54) METHOD FOR TRANSMITTING A DIGITAL MESSAGE AND SYSTEM FOR CARRYING OUT SAID METHOD

(75) Inventors: Andrey Alexejevich Plotnikov, Vyborg (RU); Said Kakhsurujevich Akajev, Vyborg (RU); Victor Fyodorovich Velikokhatsky, St. Petersburg (RU); Vadim Yevgenievich Lysy, Vyborg (RU)

(73) Assignee: Morton Finance S.A., Road Town Tortola (VG)

( * ) Notice: Subject to any disclaimer, the term of this patent is extended or adjusted under 35 U.S.C. 154(b) by 16 days.

(21) Appl. No.: 10/478,882

(22) PCT Filed: Oct. 16, 2001

(86) PCT No.: PCT/RU01/00417

§ 371 (c)(1),
(2), (4) Date: Nov. 21, 2003

(87) PCT Pub. No.: WO02/095953

PCT Pub. Date: Nov. 28, 2002

(65) Prior Publication Data

US 2004/0151107 A1    Aug. 5, 2004

(30) Foreign Application Priority Data

May 22, 2001   (RU) ............................... 2001113567

(51) Int. Cl.[7] ............................................ H03M 13/03
(52) U.S. Cl. ...................................... 341/94; 714/752
(58) Field of Search ......................... 341/94; 714/752, 714/753, 754, 755, 756

(56) References Cited

U.S. PATENT DOCUMENTS

| | | | | |
|---|---|---|---|---|
| 3,868,632 A | * | 2/1975 | Hong et al. | 714/755 |
| 4,775,979 A | | 10/1988 | Oka | |
| 4,949,294 A | * | 8/1990 | Wambergue | 708/491 |
| 5,570,379 A | | 10/1996 | Sasaki et al. | |
| 6,145,111 A | * | 11/2000 | Crozier et al. | 714/755 |
| 6,223,319 B1 | * | 4/2001 | Ross et al. | 714/755 |

FOREIGN PATENT DOCUMENTS

DE           19844140           7/2000

(Continued)

Primary Examiner—Howard L. Williams
(74) Attorney, Agent, or Firm—Fay Kaplun & Marcin, LLP (57) ABSTRACT

Described are a system and method for transmitting digital messages through wire channels and telecommunication channels using electromagnetic waves. The use of the channels is simplified by excluding multiplication and division operators from the coding and a decoding process. The system and method allows to transmit any messages from elements of Abelian group including code words whose elements are matrixes, polynomials, numbers of mixed-base notation and nonpositional notation. An encoder of the system may include a driver clock, a function g<2> calculator, a pulse generator having recurrent frequency of f(k+1)/k, a pulse recurrent frequency doubler, a ring counter up to k, an adder-accumulator of elements of Abelian group, a key, a ring counter up to (2k+1), an AND component, a main memory unit, a key, a trigger, a main memory unit and a ring counter up to (k+1). A decoder of the system may include a driver clock, an adder-accumulator of elements of Abelin groupoid, a pulse generator having recurrent frequency of fk(k+1)/k, a pulse recurrent frequency doubler, a ring counter up to (k+1), a key, a main memory unit, a key, an AND component, a ring counter up to [2(k+1)+1], an identification unit provided with a single element of Abelian group, a trigger, a main memory unit a key, a ring counter up to k.

8 Claims, 4 Drawing Sheets

FOREIGN PATENT DOCUMENTS

| | | |
|---|---|---|
| EP | 0523969 | 1/1993 |
| GB | 2216753 | 10/1989 |
| RU | 2150785 | 6/2000 |
| SU | 1798922 | 2/1993 |

* cited by examiner

Fig. 3 Encoder 1

METHOD FOR TRANSMITTING A DIGITAL MESSAGE AND SYSTEM FOR CARRYING OUT SAID METHOD

This application is a 371 of PCT/RU01/00417, filed Oct. 16, 2001.

FIELD OF THE INVENTION

This invention relates to telecommunications, in particular to methods and means for transmitting digital messages, and can be used for transmitting information through wire channels and through telecommunication channels using electromagnetic waves.

DESCRIPTION OF THE PRIOR ART

A method for transmitting digital message, consisting of additive Abelian group elements, is known which comprises consecutive steps of encoding digital message, its modulating, its transmitting in a communication channel, demodulating of the received signal and its decoding [1].

A system for transmitting digital messages, consisting of additive Abelian group elements, is known which comprises consecutively connected at the transmitting side an encoder, a modulator and a transmitter and sequentially connected at the receiving side a receiver, a demodulator and a decoder [1].

The known method and system are rather complicated in a realization because they use four arithmetic operations for processes of encoding and decoding.

SUMMARY OF THE INVENTION

A technical result achieved when using proposed method and system consist of simplifying their realization due to exclusion multiplication and division operations from processes of encoding and decoding. This provides an opportunity for transmitting any messages consisting of Abelian group elements, in particular encoded words, with elements in a form of matrixes, polynomials, numerals in a mixed and non-positional number system, whereas codes, organized in accordance with proposed rules, correspond to a class of systematic linear block codes.

The above-mentioned technical result is achieved in that in a method for transmitting a digital message consisting of additive Abelian group elements, which method comprises consecutive steps of encoding the messages, its modulating, its transmitting into communication channel, demodulating of the received signal and its decoding, the encoding is done according to the rule: $Y_n = X_k \otimes G$, where $X_k$ is a vector-row of the initial message, consisting of k information elements, $Y_n$ is a vector-row of the encoded message consisting of k information and one check elements, G—a generating matrix of operations which consists of k rows and (k+1) columns, generated from a k×k matrix, with operations $g^0$ at the diagonal and operations $g^1$ at other positions, and an additional column which is added to a k×k matrix at its right and which contains a sequence of operations $g^0$ or operations $g^2$ at all positions, or matrix obtained from said generating matrix of operations by rearranging of its rows and/or columns, $\otimes$ is operation of generalized matrix multiplication according to the rule: $y_j = {}^\oplus\Sigma g^v_{ij}(x_i)$ for $j \leq k$, and $y_j = g^2$ [${}^\oplus\Sigma g^v_{ij}(x_i)$] for j=k+1, if the additional column contains a sequence of operations $g^0$, or according to the rule: $y_j = {}^\oplus\Sigma g^v_{ij}(x_i)$, if the additional column contains a sequence of operations $g^2$, where $y_j$ is a j-th element of a vector-row for an encoded message, ${}^\oplus\Sigma g^v_{ij}(x_i) = g^v_{1j}(x_1) \oplus g^v_{2j}(x_2) \oplus \ldots \oplus g^v_{kj}(x_k)$, $\oplus$ is operation for summing elements in an Abelian group, $g^v_{ij}(x_i)$ is operation $g^v$ for element $x_i$ according to the rule for a ij-th matrix element, v=[0, 2], i=[1, k], j=[1, k+1], $g^0 = x_i \oplus e$, $g^1 = x_i \oplus (-x_i)$, $g^2 = x_i \oplus (-x_i) \oplus (-x_i)$, e is unity element of an Abelian group, and the decoding of the demodulated message $Y'_n$ is done by excluding from the vector-row $Y'_n$ of the element which corresponds by its number to the additional column of a generating matrix of operations G under the provision $H \otimes Y'_n{}^T = e$, where $Y'_n{}^T$ is a transposed vector-row $Y'_n$, and H is a 1×(k+1) check matrix of operations generated by transposition of the additional column, by adding operation $g^0$ to its right, if the additional column contains a sequence of operations $g^0$, and by rearranging the columns exactly like the rearranging of the columns of the generating matrix of operations, or in the same way but exchanging operations $g^2$ for operations $g^0$, if the additional column contains a sequence of operations $g^2$.

The above-mentioned technical result is also achieved by the fact that under the condition that the message elements belong to a ring with a unity, the operation $g^0$ is multiplication by unity, operation $g^1$ is multiplication by zero and operation $g^2$ is multiplication by minus unity.

The above-mentioned technical result is also achieved by the fact that under the condition that the message elements belong to a residue class ring to the modulo q, where q is a natural number, operation $\oplus$ is the operation of summing to the modulo q.

The above-mentioned technical result is also achieved by providing that in a system for transmitting a digital message consisting of additive Abelian group elements, which system comprises consequently connected at the transmitting side an encoder, the input of which corresponds to the system's input, a modulator and a transmitter, and consequently connected at the receiving side a receiver, a demodulator and a decoder, the output of which corresponds to the system's output, the encoder is in a form capable of performing algorithm $Y_n = X_k \otimes G$, where $X_k$ is vector-row of an initial message consisting of k information elements, $Y_n$ is vector-row of the encoded message consisting of k information and one check elements, G is generating matrix of operations which consists of k rows and (k+1) columns, produced from k×k matrix, with operations $g^0$ at the diagonal and operations $g^1$ at other positions, and an additional column which is added to the k×k matrix at its right and which contains a sequences of operations $g^0$ or operations $g^2$ at all positions, or a matrix obtained from said generating matrix of operations by rearranging of its rows and/or columns, $\otimes$ is operation of generalized matrix multiplication according to the rule: $y_j = {}^\oplus\Sigma g^v_{ij}(x_i)$ for $j \leq k$, and $y_j = g^2$ [${}^\oplus\Sigma g^v_{ij}(x_i)$] for j=k+1, if the additional column contains a sequence of operations $g^0$, or in according to the rule:

$y_j = {}^\oplus\Sigma g^v{}_{ij}(x_i)$, if the additional column contains a sequence of operations $g^2$, where $y_j$ is j-th element of the vector-row of the encoded message, ${}^\oplus\Sigma g^v{}_{ij}(x_i) = g^v{}_{1j}(x_1) \oplus g^v{}_{2j}(x_2) \oplus \ldots \oplus g^v{}_{kj}(x_k)$, $\oplus$ is operation for summing elements in an Abelian group, $g^v{}_{ij}(x_i)$ is operation $g^v$ for element $x_i$ according to the rule for a ij-th matrix element, $v = [0,2]$, $i = [1, k]$, $j = [1, k+1]$, $g^0 = x_i \oplus e$, $g^1 = x_i \oplus (-x_i)$, $g^2 = x_i \oplus (-x_i) \oplus (-x_i)$, e is unity element of an Abelian group, and the decoder is in a form which provides for the exclusion from a vector-row $Y'_n$ of the element which corresponds by its number to the additional column of an generating matrix of operations G under the provision that $H \otimes Y'_n{}^T = e$, where $Y'_n{}^T$ is transposed vector-row $Y'_n$, H is 1×(k+1) check matrix of operations generated by transposition of the additional column by adding operation $g^0$ to its right, if the additional column contains a sequence of operations $g^0$, and by rearranging the columns exactly like the rearranging of the columns of the generating matrix of operations, or in the same way but exchanging operations $g^2$ for operations $g^0$, if the additional column contains a sequence of operations $g^2$.

The above-mentioned technical result is also achieved by providing that the encoder contains the first operative memory unit, k outputs of which are connected to the corresponding first k information inputs of the second operative memory unit, the output of which forms the encoder output, consecutively connected a calculation unit for calculating function $g^2$, the first adder, for summing of Abelian group elements, the input of which is connected to its second input, the first switch, the output of which is connected to the (k+1)-th information input of the second operative memory unit, consecutively connected the first pulse shape forming unit and the first ring counter, which count up to k, the overflow output of which is connected to a control input of the first switch and to the reset input of the first operative memory unit, consecutively connected the pulse generator with a repetition frequency of f(k+1)/k, the second switch and the first ring counter which counts up to (k+1), the information output of which is connected to the address input of the second operative memory unit, the first gate AND, the output of which is connected to a control input of the second switch, the first flip-flop, the output of which is connected to a direct input of the first gate AND, the inverting input of which is connected to the overflow output of the first ring counter which counts up to (k+1) and to the reset input of the first flip-flop, consecutively connected the first pulse repetition frequency doubling unit, the input of which is connected to the output of the pulse generator with a repetition frequency of f(k+1)/k, and the ring counter which counts up to (2k+1), the overflow output of which is connected to a counting input of the first flip-flop, and that the combined information inputs of the first operative memory unit and the calculation unit for calculating function $g^2$, the start input of the pulse shape forming unit and a synchronization input of the pulse generator with a repetition frequency of f(k+1)/k together form the encoder input, whereby f is the repetition frequency of the encoded word elements in a digital message.

The above-mentioned technical result is also achieved by providing that the decoder contains the third operative memory unit with (k+1) outputs connected to corresponding first (k+1) information inputs of the fourth operative memory unit, an output of which forms a decoder output, consequently connected the second adder for summing of Abelian group elements, the output of which is connected to its second input, the third switch, the identification unit for identifying the correspondence to the unity element of an Abelian group, and the fourth switch, the output of which is connected to an address input of the fourth operative memory unit, consequently connected the second pulse shape forming unit and the second ring counter which counts up to (k+1), the overflow output of which is connected to the control input of the third switch and to the reset input of the third operative memory unit, consequently connected the pulse generator with a repetition frequency of fk/(k+1), the fifth switch and the second ring counter which counts up to k, the information output of which is connected to the information input of the fourth switch, the second gate AND, the output of which is connected to the control input of the fifth switch, the second flip-flop, the output of which is connected to the direct input of the second gate AND, an inverting input of which is connected to the overflow output of the second ring counter which counts up to k and to the reset input of the second flip-flop, consequently connected the second pulse repetition frequency doubling unit, the input of which is connected to the output of the pulse generator with a repetition frequency of fk/(k+1), and the ring counter which counts up to [2(k+1)+1], the overflow output of which is connected to the counting input of the second flip-flop, and the combined information inputs of the third operative memory unit and the second adder for summing of Abelian group elements, the start input of the second pulse shape forming unit and the synchronization input of the pulse generator with a repetition frequency of fk/(k+1) together form the decoder input, whereby f is the repetition frequency of the encoded word elements in a digital message.

DETAILED DESCRIPTION OF THE INVENTION

Figure 2:
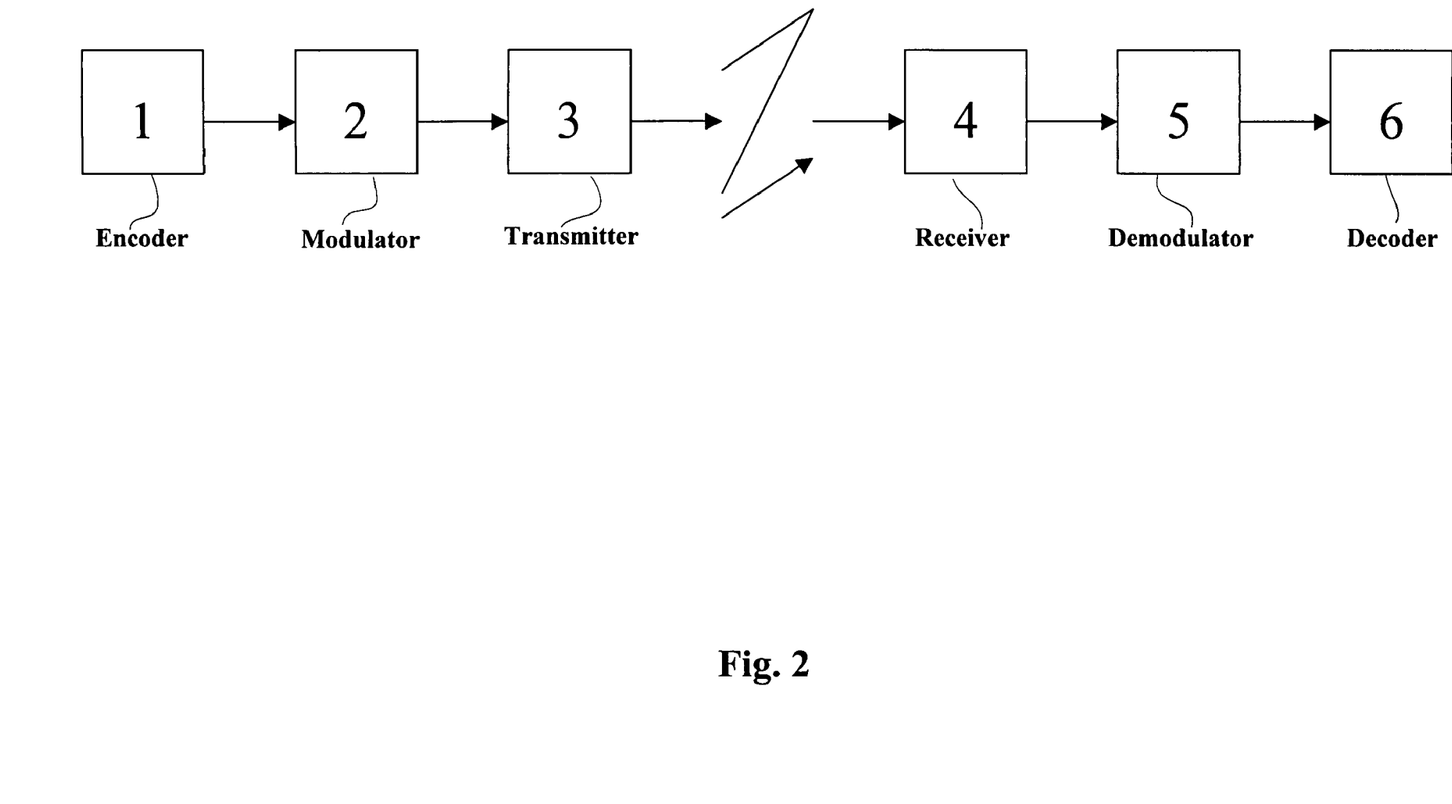
FIG. 2 illustrates a functional electrical block scheme of a system for transmitting a digital message.

A system for transmitting digital message consists of encoder 1, modulator 2, transmitter 3, a receiver 4, a demodulator 5 and a decoder 6.

Figure 3:
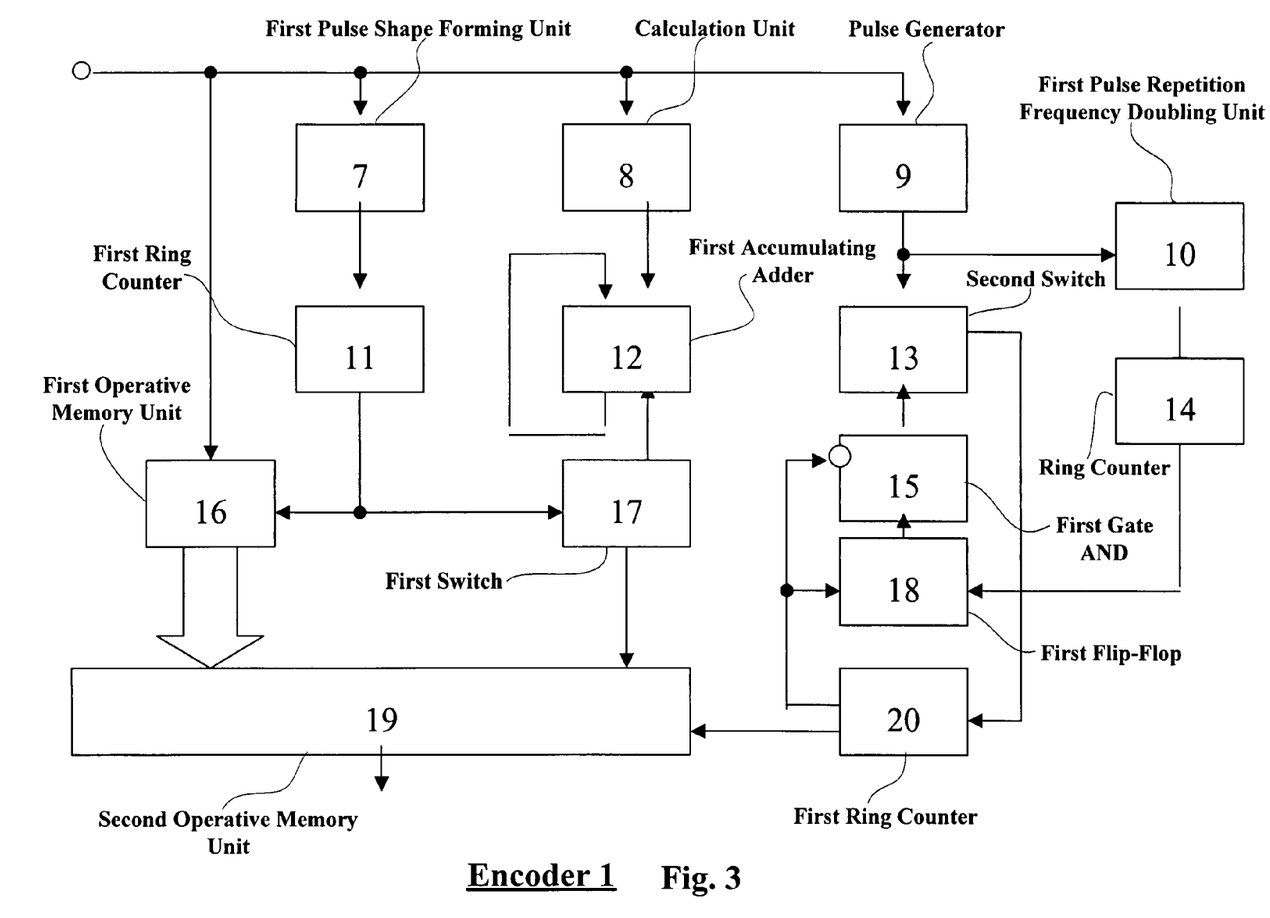
FIG. 3 illustrates a functional electrical block scheme of an encoder.

Encoder 1 consists of the first pulse shape forming unit 7, calculation unit 8 for calculating function $g^2$, the pulse generator 9 with a repetition frequency of f(k+1)/k, first pulse repetition frequency doubling unit 10, first ring counter 11 which counts up to k, first accumulating adder 12 for summing of Abelian group elements, second switch 13, ring counter 14 which counts up to (2k+1), first gate AND 15, first operative memory unit 16, first switch 17, first flip-flop 18, second operative memory unit 19 and the first ring counter 20 which counts up to (k+1).

Figure 4:
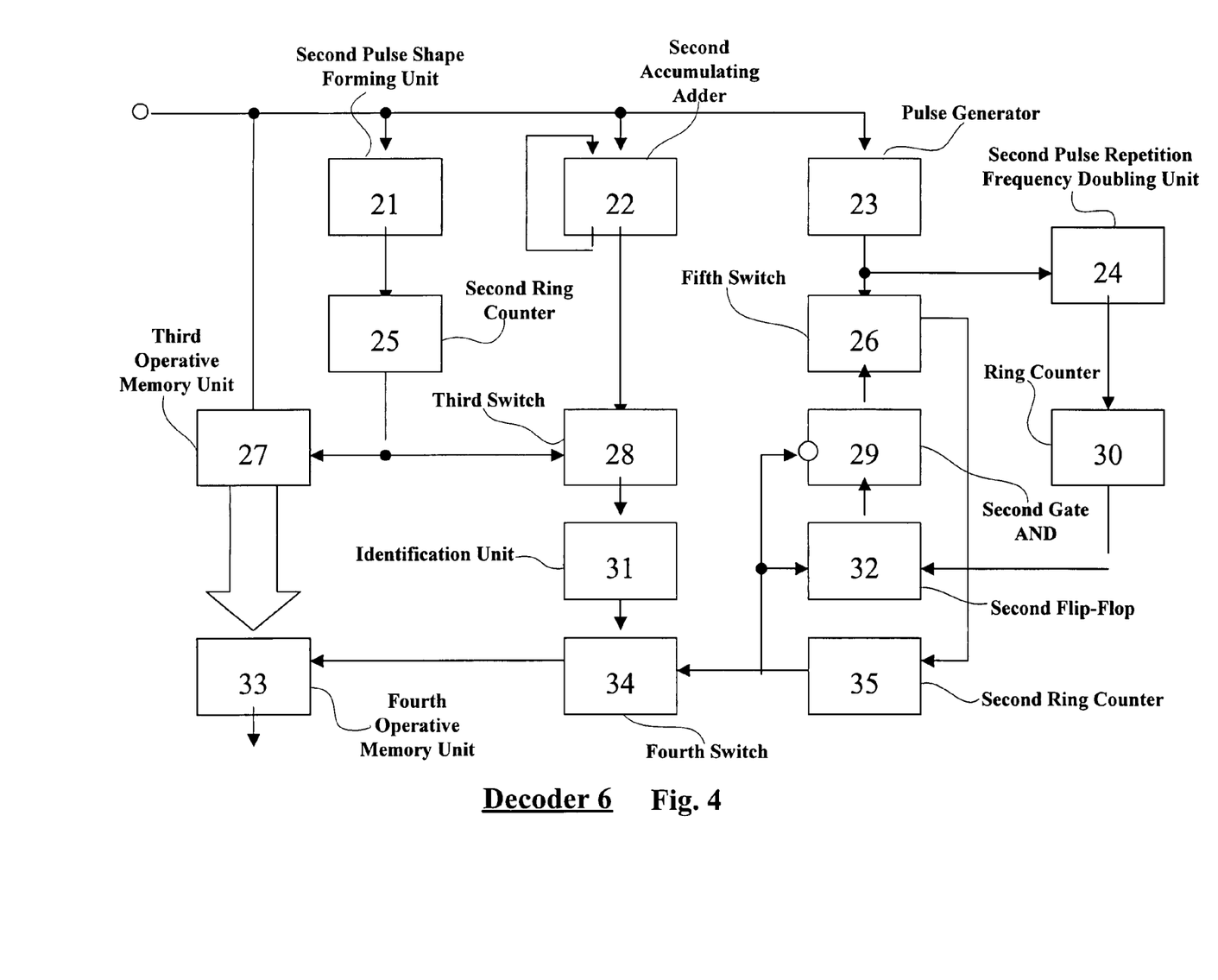
FIG. 4 illustrates a functional electrical block scheme of a decoder.

Decoder 6 consists of second pulse shape forming unit 21, second accumulating adder 22, for summing of an Abelian group elements, pulse generator 23 with a repetition frequency of fk/(k+1), second pulse repetition frequency doubling unit 24, second ring counter 25 which counts up to (k+1), fifth switch 26, third operative memory unit 27, third switch 28, second gate AND 29, ring counter 30 which counts up to [2(k+1)+1], identification unit 31, for identifying the correspondence to the unity element of an Abelian group, second flip-flop 32, fourth operative memory unit 33, fourth switch 34, second ring counter 35 which counts up to k.

A method for transmitting digital message is realized as the follows.

A generating matrix of operations G with k rows and (k+1) columns is formed, said matrix is produced with a help of a k×k matrix with operations $g^0$ at its diagonal and operations $g^1$ at other positions and with a help of an additional column, which is added from the right to said k×k matrix and corresponds to a sequence of operations $g^0$ or operations $g^2$, situated at every position. It's possible, also, to use a generating matrix of operations, produced with a help of said generating matrix of operations by rearranging its rows and/or columns. The resulting generating matrix of operations is a matrix, formed not of numbers, as usual matrixes, but of records, recommending to produce a corresponding operation in situations, when a corresponding element of a generating matrix of operations is initiated.

An operation of adding additional column is produced with a purpose to introduce, into a transmitted message, check elements which are used for finding out errors in a received message, if they appear in a process of a message transmission through a communication channel.

A digital message $X_k$, generated with a corresponding source, is encoded by producing generalized matrix multiplication of a vector-row $X_k$ into an above-mentioned generating matrix of operations G.

A procedure of a generalized matrix multiplication operation is quite the same with a procedure of a usual matrix multiplication because it's produced in the same way, as the following: paired interaction operations are produced for a i-th element of a vector-row $X_k$ and every ij-th element (which is situated at a crossing of a i-th row and a j-th column) of an operation matrix G and than results of i-th operations are summed with forming a j-th element of a vector-row $Y_n$. As a result, every above-mentioned operation, which is required for producing generalized matrix multiplication operation, can be interpreted as a summing operation in accordance with rules, formulated for elements of an Abelian group [2, p. 140], which contains elements of a digital message $X_k$ (with k information elements), formed with a corresponding source. Operations $g^v(g^0, g^1$ and $g^2$) correspond to summing operations with a unity element of a group [2, p. 139], to summing operations with an inverse element of a group [2, p. 140] and to two-fold summing operations with an inverse element of a group, correspondingly.

An encoded message is modulated and transmitted to a communication channel.

A received message is demodulated and decoded. Decoding is produced using operations of a generalized matrix multiplication of a check matrix H by a transposed vector-row $Y_n^T$.

A 1×n check matrix of operations H is formed by transposing additional matrix, by adding operation $g^0$ to this matrix from the right, if an additional column corresponds to a sequence of operations $g^0$, or in the same way with changing operations $g^2$ for $g^0$, if an additional column corresponds to a sequence of operations $g^2$, and by rearranging columns (if an generating matrix of operations formation was done by rearranging columns) in the same way with rearranging columns for an generating matrix of operations.

If a value, got as a result of a multiplication, equals a unity element of a group (this fact informs about an error absence in a received message), an element with number, corresponding to a number of an additional column in an generating matrix of operations G, is excluded from a vector-row $Y'_n$; so, a check element, inserted into a message during a process of encoding, is discarded.

If message elements belong to a ring with a unity, which corresponds to one of the variants for an additive Abelian group, operations $g^0$ degenerate into operations with a multiplication into a unity, operations $g^1$ degenerate into operations with a multiplication into a zero and operations $g^2$ degenerate into operations with a multiplication into a minus unity.

If message elements belong to a residue class ring on the modulo q, which corresponds to one of the variants for a ring with a unity, an operation $\oplus\Sigma$ is transformed into an operation of summing on the modulo q.

Figure 1:
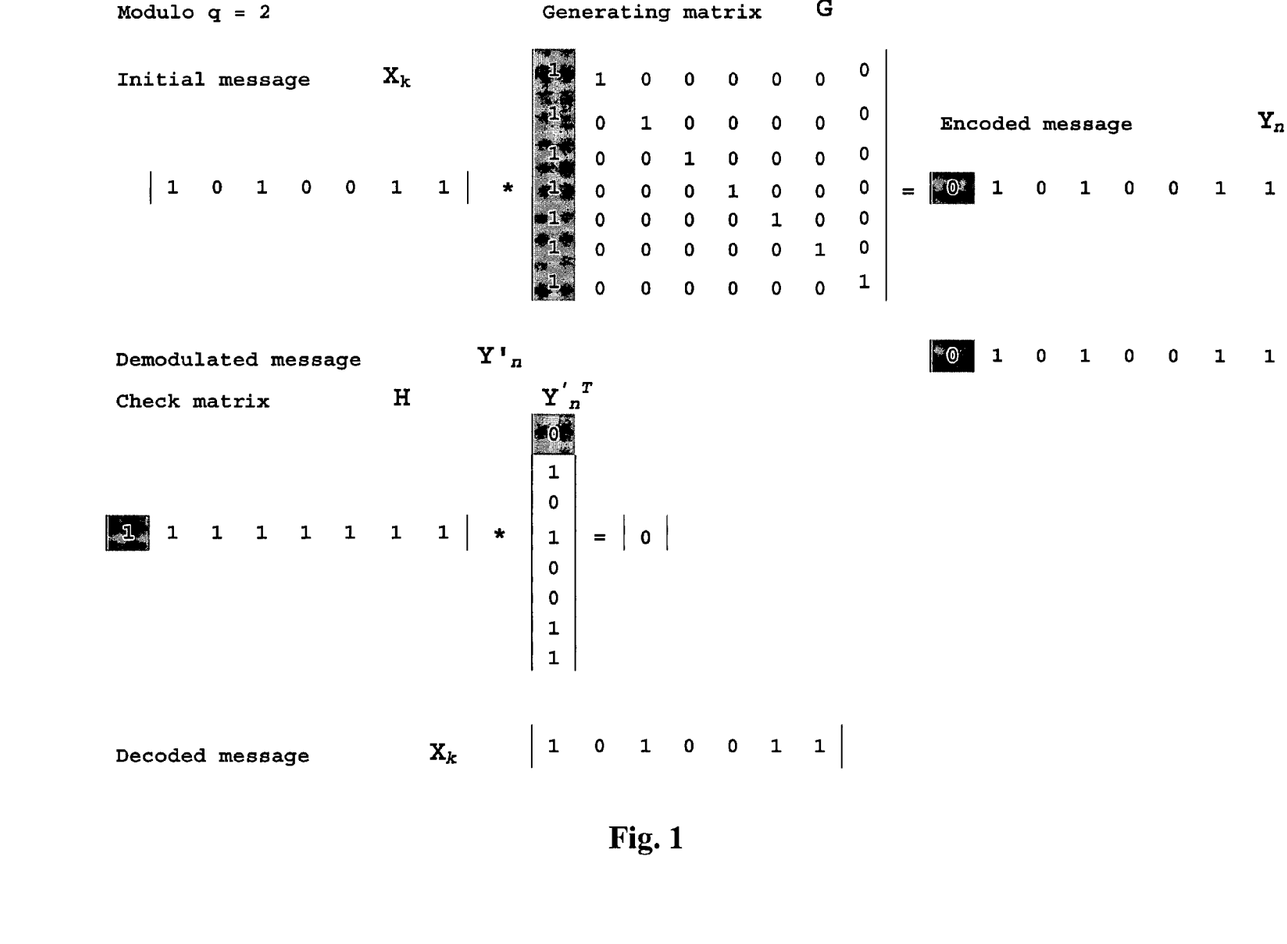
FIG. 1 illustrates an example of coding and decoding of individual message.

FIG. 1 illustrates an example of transmitting message $X_k$, consisting of seven binary elements. An generating matrix of operations G is formed in accordance with the above-mentioned rule. In this case an additional column is inserted in the first position. After producing generalized matrix multiplication of a vector-row $X_k$ into a matrix G an encoded message vector-row $Y_n$ with a check element in the first position is formed.

A demodulated message $Y'_n$ is received without errors. So, producing generalized matrix $Y'_n{}^T$ element of a group. Than decoding is done by discarding check element, in particular by extracting elements of an initial message.

A system for transmitting digital message is operated in the following way.

Every element of a digital message $X_k$, formed with a corresponding source and consisting of consequently transmitted code words with a size of k elements each, gets at an input of an encoder 1 and further at information inputs of the first operative memory unit 16 and the calculation unit 8. At the same time this element starts the first pulse shape forming unit 7 and synchronizes the pulse generator 9. A pulse from an output of the first pulse shape forming unit 7 starts the first ring counter 11. The first counter 11 provides counting for pulses, coming at its input, and elements of a code word are stored in corresponding cells of the first operative memory unit 16 and are conversed with the calculation unit 8 in accordance with a rule $g^2$. Results of a conversion, produced for message elements, are transferred to an input of a first accumulating adder 12, where every next conversed element is summarized with a sum of previous elements in accordance with a rule for summing elements of an Abelian group, and forming a check element for its inserting into a transmitted code word. After transferring a k-th element of a code word to an input of the first ring counter 11 a pulse is formed at its overflow output and this pulse opens the first switch 17, resets the first operative memory unit 16 and transfers an information from outputs of the first operative memory unit 16 to first k memory cells of the second operative memory unit 19. At the same time this pulse transfers an information from outputs of the first adder 12 to a (k+1)-th memory cell of the second operative memory unit 19. Pulses from an output of the generator 9 with a repetition frequency value, exceeding (k+1)/k times a repetition frequency value for elements in a code word, get at an information input of the second switch 13, which, being kept initially in a closed state, doesn't transfer them to an input of the first ring counter 20. The same pulses are transferred to an input of the first frequency doubling unit 10, which doubles a repetition frequency for coming pulses. Then pulses are transferred from an output of the unit 10 to an input of the ring counter 14. When a (2k+1)-th pulse is transferred (approximately in a middle of a time interval between a moment, when the last element of a current code word comes to an input of an encoder 1, and a moment, when the first element of a next code word comes to this input) to an input of the ring counter 14, a pulse is formed at an overflow output of the counter 14 and is transferred to a counting input of the first flip-flop 18, changing a state of this flip-flop. A voltage signal of a "logical unity", formed at an output of the first flip-flop 18, is transferred to a direct input of the first gate AND 15. The first ring counter 20 hasn't begun to count, yet, and a voltage signal of a "logical zero" is kept at its overflow output; so, a voltage signal of a "logical unity" appears at an output of the first gate AND 15 and this signal helps to open the second switch 13. Pulses from an output of the generator 9 begins to come to an input of the first ring counter 20; as a result, a code appears at an information output of the counter 20 and this code is changed with every next counted pulse. This code, after getting at an address input of the second operative memory unit 19, initializes an information reset in its corresponding memory cell, using the same sequential number with a pulse, counted with the first ring counter 20, and k information and one check elements of a code word are transferred sequentially to an input of a modulator 2. After transferring a n-th pulse to an input of the first ring counter 20 a voltage signal of a "logical unity" is formed at its overflow output and this voltage signal changes a state of the first flip 18; so, a voltage signal of a "logical zero" appears at an output of the first gate AND 15 and this voltage signal closes the first switch 13 and stops getting pulses from an output of the generator 9 to an input of the second ring counter 20, which gets prepared for a next operation cycle.

A modulated message is transferred from an output of a modulator 2 to an input of a transmitter 3 and further to a communication channel.

A received message, after being transferred through a receiver 4, gets demodulated in a demodulator 5 and is transferred to an input of a decoder 6.

Every element in a received code word gets, after being transferred to an input of a decoder 6, at information inputs of the third operative memory unit 27 and the calculation unit 22, starts the second pulse shape forming unit 21 and synchronizes the generator 23. A pulse from an output of the second pulse shape forming unit 21 starts the second ring counter 25. When the second ring counter 25 counts pulses, coming to its input, elements of a code word are stored in corresponding cells of the third operative memory unit 27 and the second accumulating adder 22 determines a result of summing elements of a code word, received at its input, in accordance with a rule of summing elements of an Abelian group. After transferring a (k+1)-th element of a code word to an input of the second ring counter 25 a pulse is formed at its overflow output and this pulse opens the third switch 28, resets the third operative memory unit 27 and transfers an information from its outputs to memory cells of the fourth operative memory unit 33 and from outputs of the second accumulating unit 22 to the identification unit 31, correspondingly. When a sum, getting at an input of the identification unit 31, equals a unity element of an Abelian group, a voltage signal of a "logical unity" is transferred to a control input of the fourth switch 34 and this switch gets opened. Pulses from an output of the generator 23 with a repetition frequency, value of which is exceeded k/(k+1) times with a value of a repetition frequency for elements in a code word, get to an information input of the fifth switch 26, which, being kept initially in a closed state, doesn't transfer these pulses to an input of the second ring counter 35. The same pulses are transferred to an input of the second frequency doubling unit 24, which doubles a repetition frequency for coming pulses; pulses from an output of the unit 24 are transferred to an input of the second ring counter 30. When a [2(k+1)+1]-th pulse gets (approximately in a middle of a time interval between a moment, when the last element of a current code word comes to an input of a decoder 6, and a moment, when the first element of a next code word comes to this input) at an input of the ring counter 30, a pulse from an overflow output of the counter 30 is transferred to a counting input of the second flip-flop 32 and changes a state of this flip-flop. A voltage signal of a "logical unity" appears at an output of the second flip-flop 32 and this voltage signal is transferred to a direct input of the second gate AND 29. The second ring counter 35 hasn't begun to count, yet, and a voltage signal of a "logical zero" is kept at its overflow output; so, a voltage signal of a "logical unity" appears at an output of the second gate AND 29 and opens the fifth switch 26. Pulses from an output of the generator 23 begins to come to an input of the second ring counter 35; as a result, a code appears at an information input of this counter and this code is changed with every next counted pulse. This code is transferred through the just opened fourth switch 38 and, after getting at address input of the fourth operative memory unit 33, initializes an information reset it its cell with a sequential number, corresponding to a number of a pulse, counted with the second ring counter 35, and k information elements of a code word are transferred sequentially to a decoder output, in particular to a user. A check element is kept, as discarded, in a (k+1)-th memory cell of the fourth operative memory unit 33 and is changed in this cell with a check element of a next code word. After transferring a k-th pulse to an input of the second ring counter 35 a voltage signal of a "logical unity" appears at its overflow output and this voltage signal changes a state of the first flip-flop 32; then a voltage signal of a "logical zero" is formed at an output of the second gate AND 29 and this voltage signal closes the fifth switch 26 and stops getting pulses from an output of the generator 23 to an input of the second ring counter 35, which gets prepared for a next operation cycle.

LITERATURE

1. J. Clark, J. Cane. Coding with an error correction in digital communication systems, translated from English by S. I. Gelfand, Under edition of B. S. Tsybakov, Issue 28, Moscow, Publisher "Radio i svyaz", 1987. p.p. 9–18, fig. 1.2.
2. A. I. Kostrikin, Introduction for an algebra, Moscow, Publisher "Nauka", 1977.

What is claimed is:

1. A method for transmitting of a digital message which includes information elements of an additive Abelian group, comprising the steps of:
   coding the message,
   modulating the encoded message into a signal;
   transmitting the signal using a communication channel;
   demodulating the received signal into the encoded message; and
   decoding the encoded message into the message,
   wherein, in the coding step, the message is encoded according to a formula: $Y_n = X_k \otimes G$, where
   $X_k$ is a vector-row of the message which includes a k-number of the elements,
   $Y_n$ is a vector-row of the encoded message which includes the k-number of the elements and a check element,
   G is a generating matrix of operations which consists of a k-number of rows and a (k+1)-number of columns, the generating matrix G including one of a matrix G' and a matrix G", where
   G' is generated by (a) a k×k size matrix with operations $g^0$ diagonal positions and operations $g^1$ at other positions and (b) the (k+1)th column which is added to the k×k size matrix from the right, the (k+1)th column representing a sequence of one of the operations $g^0$ and operations $g^2$, and
   G" is generated from G' by rearranging at least one of the rows and the columns,
   $\otimes$ is an operation of a generalized matrix multiplication in accordance with one of the following rules:
   (i) $y_j = {}^{\oplus}\Sigma g^v_{ij}(x_i)$ for $j \leq k$ and $y_j = g^2[{}^{\oplus}\Sigma g^v_{ij}(x_i)]$ for $j = k+1$, when the (k+1)th column corresponds to the sequence of operations $g^0$, and
   (ii) $y_j = {}^{\oplus}\Sigma g^v_{ij}(x_i)$, when the (k+1)th column corresponds to the sequence of operations $g^2$,
   where
   $y_j$ is a j-th element of the vector-row of the encoded message,
   ${}^{\oplus}\Sigma g^v_{ij}(x_i) = g^v_{1j}(x_1) \oplus g^v_{2j}(x_2) \oplus \ldots \oplus g^v_{kj}(x_k)$,
   $\oplus$ is an operation of summing the elements of the Abelian group,
   $g^v_{ij}(x_i)$ is an operation $g^v$ for an element $x_i$ in accordance with a rule for a
   ij-th matrix element,
   $v = [0,2]$,
   $i = [1,k]$,
   $j = [1,k+1]$,
   $g^0 = x_i \oplus e$,
   $g^1 = x_i \oplus (-x_i)$,
   $g^2 = x_i \oplus (-x_i) \oplus (-x_i)$, and
   e is a unity element of the Abelian group,
   wherein, in the decoding step, the encoded message is decoded by excluding from the vector-row $Y'_n$ a particular element, a number of the particular element corresponding to the (k+1)th column, provided that $H \otimes Y'^T_n = e$, where
   $Y'^T_n$ is a transposed vector-row $Y'_n$, and
   H is a check matrix of operations having a 1×(k+1) size which is generated, using a transposition process of the (k+1)th column, by one of the following:
   (i) adding to the right of the (k+1)th column the operation $g^0$ and rearranging the columns, when the (k+1)th column includes the sequence of operations $g^0$, and
   (ii) adding to the right of the (k+1)th column the operation $g^2$ and rearranging the columns, when the (k+1)th column includes the sequence of operations $g^2$.

2. The method according to claim 1, wherein, when the elements of the message belong to a ring with a unity, the operation $g^0$ is an operation of a multiplication by the unity, the operation $g^1$ is an operation of a multiplication by a zero element of the ring and the operation $g^2$ is an operation of a multiplication by a minus unity element of the ring, a sum of the unity and the minus unity element being equal to the zero element.

3. The method according to claim 2, wherein, when the elements of the message belong to a residue class ring to a module q, the operation $\oplus$ is a summing operation to the module q which is a natural number.

4. The method according to claim 1, wherein when the elements of the message belong to a residue class ring to a module q, the operation $\oplus$ is a summing operation to the module q which is a natural number.

5. A system for transmitting of a digital message which includes elements of an additive Abelian group, comprising:
   a transmitting arrangement including serially connected an encoder, a modulator and a transmitter, an input of the encoder being an input of the system; and
   a receiving arrangement including serially connected a receiver, a demodulator and a decoder, an output of the decoder being an output of the system,
   wherein the encoder codes the message according to the following algorithm: $Y_n = X_k \otimes G$, where
   $X_k$ is a vector-row of the message which includes a k-number of the elements,
   $Y_n$ is a vector-row of the encoded message which includes the k-number of the elements and a check element,
   G is a generating matrix of operations which consists of a k-number of rows and a (k+1)-number of columns, the generating matrix G including one of a matrix G' and a matrix G", where
   G' is generated by (a) a k×k size matrix with operations $g^0$ diagonal positions and operations $g^1$ at other positions and (b) the (k+1)th column which is added to the k×k size matrix from the right, the (k+1)th column representing a sequence of one of the operations $g^0$ and operations $g^2$, and
   G" is generated from G' by rearranging at least one of the rows and the columns,
   $\otimes$ is an operation of a generalized matrix multiplication in accordance with one of the following rules:
   (i) $y_j = {}^{\oplus}\Sigma g^v_{ij}(x_i)$ for $j \leq k$ and $y_j = g^2[{}^{\oplus}\Sigma g^v_{ij}(x_i)]$ for $j = k+1$, when the (k+1)th column corresponds to the sequence of operations $g^0$, and
   (ii) $y_j = {}^{\oplus}\Sigma g^v_{ij}(x_i)$, when the (k+1)th column corresponds to the sequence of operations $g^2$,
   where
   $y_j$ is a j-th element of the vector-row of the encoded message,
   ${}^{\oplus}\Sigma g^v_{ij}(x_i) = g^v_{1j}(x_1) \oplus g^v_{2j}(x_2) \oplus \ldots \oplus g^v_{kj}(x_k)$,
   $\oplus$ is an operation of summing the elements of the Abelian group,
   $g^v_{ij}(x_i)$ is an operation $g^v$ for an element $x_i$ in accordance with a rule for a
   ij-th matrix element,
   $v = [0,2]$,
   $i = [1,k]$,
   $j = [1,k+1]$,
   $g^0 = x_i \oplus e$, $g^1 = x_i \oplus (-x_i)$,
$g^2 = x_i \oplus (-x_i) \oplus (-x_i)$, and
e is a unity element of the Abelian group,
wherein, the decoder decodes the encoded message by excluding from the vector-row $Y'_n$ a particular element, a number of the particular element corresponding to the (k+1)th column, provided that $H \otimes Y'^T_n = e$, where
$Y'^T_n$ is a transposed vector-row $Y'_n$, and
H is a check matrix of operations having a 1×(k+1) size which is generated, using a transposition process of the (k+1)th column, by one of the following:
(i) adding to the right of the (k+1)th column the operation $g^0$ and rearranging the columns, when the (k+1)th column includes the sequence of operations $g^0$, and
(ii) adding to the right of the (k+1)th column the operation $g^2$ and rearranging the columns, when the (k+1)th column includes a sequence of operations $g^2$.

6. The system according to claim 5, wherein the encoder includes:
a first operative memory unit,
a second operative memory unit, a k number of outputs of the first operative memory unit being connected to corresponding first k number of inputs of the second memory unit, an output of the second memory unit being an output of the encoder output,
a calculation unit calculating the operation $g^2$,
a first accumulating adder summing the elements of the Abelian group and having a first input and a second input, the first input being connected to an output of the calculating unit, the second input being connected to an output of the first accumulating adder,
a first switch having an output connected to a (k+1)th input of the second operative memory unit, the first switch, the first accumulating adder and the calculation unit being serially connected,
a first pulse shape forming unit,
a first ring counter counting up to k, the first ring counter including an overflow output connected to a control input of the first switch and a reset input of the first operative memory unit, the first ring counter and the first pulse shape forming unit being serially connected,
a pulse generator having a repetition frequency of f(k+1)/k, f corresponding to a repetition frequency for the elements of the message,
a first prime ring counter counting up to (k+1) and having an information output connected to an address input of the second operative memory unit,
a second switch being serially connected to the pulse generator and the first prime ring counter, the second switch having an output connected to an input of the first prime ring counter,
a first gate AND having an output connected to a control input of the second switch and a negative input connected to an input of the first prime ring counter.
a first flip-flop having an output connected to a direct input of the first gate AND, an inverting input of the first flip-flap being connected to an overflow output of the first prime ring counter and a reset input of the first flip-flop,
a first secondary ring counter counting up to (2k+1) and having an input connected to an output of the pulse generator and an overflow output connected to a counting input of the first flip-flop, and
a first pulse repetition frequency doubling unit serially connected and the first secondary ring counter,
wherein combined information inputs of the first operative memory unit and the calculation unit, a start input of the pulse shape forming unit and a synchronization input of the pulse generator form an encoder input.

7. The system according to claim 6, wherein the decoder includes:
a third operative memory unit,
a fourth operative memory unit, a (k+1) number of outputs of the third operative memory unit being connected to a corresponding first (k+1) number of inputs of the fourth operative memory unit, an output of the fourth operative memory unit forming an output of the decoder,
a third switch,
a second accumulating adder summing the elements and having a first output connected to an input of the third switch and a second output connected to an input of the second accumulating adder,
an identification unit identifying correspondence to a unity element of the Abelian group,
a fourth switch having an output connected to an address input of the fourth operative memory unit, the fourth switch, the identification unit, the third switch and the second accumulating adder being serially connected,
a second pulse shape forming unit,
a second ring counter counting up to (k+1) and having an overflow output connected to a control input of the third switch and a reset input of the third operative memory unit, the second ring counter being serially connected to the second pulse shape forming unit,
a pulse generator having a repetition frequency of fk/(k+1), f corresponding to a repetition frequency for the elements of a code word in the message,
a second prime ring counter counting up to k and having an information output connected to an information input of the fourth switch,
a fifth switch having an output connected an input of the second prime ring counter,
a second gate AND having an output connected to a control input of the fifth switch,
a second flip-flop having an output connected to a direct input of the second gate AND, an inverting input of the second flip-flop being connected to an overflow output of the second prime ring counter and a reset input of the second flip-flop, the second flip-flop, the second gate AND, the second prime ring counter, the fifth switch and the pulse generator being serially connected, the overflow output of the second prime ring counter being connected with an input of the second flip-flop and a negative input of the second gate AND,
a second secondary ring counter counting up to [2(k+1)+1] and having an output connected to an input of the second flip-flop, and
a second pulse repetition frequency doubling unit having an input connected to an output of the pulse generator and serially connected to the second secondary ring counter,
wherein combined information inputs of the third operative memory unit and the second accumulating adder, a start input of the second pulse shape forming unit and a synchronization input of the pulse generator form an input of the decoder.

8. The system according to claim 5, wherein the decoder includes:

a third operative memory unit, a fourth operative memory unit, a (k+1) number of outputs of the third operative memory unit being connected to a corresponding first (k+1) number of inputs of the fourth operative memory unit, an output of the fourth operative memory unit forming an output of the decoder, a third switch, a second accumulating adder summing the elements and having a first output connected to an input of the third switch and a second output connected to an input of the second accumulating adder, an identification unit identifying correspondence to a unity element of the Abelian group, a fourth switch having an output connected to an address input of the fourth operative memory unit, the fourth switch, the identification unit, the third switch and the second accumulating adder being serially connected, a second pulse shape forming unit, a second ring counter counting up to (k+1) and having an overflow output connected to a control input of the third switch and a reset input of the third operative memory unit, the second ring counter being serially connected to the second pulse shape forming unit, a pulse generator having a repetition frequency of fk/(k+1), f corresponding to a repetition frequency for the elements of a code word in the message, a second prime ring counter counting up to k and having an information output connected to an information input of the fourth switch, a fifth switch having an output connected an input of the second prime ring counter, a second gate AND having an output connected to a control input of the fifth switch, a second flip-flop having an output connected to a direct input of the second gate AND, an inverting input of the second flip-flop being connected to an overflow output of the second prime ring counter and a reset input of the second flip-flop, the second flip-flop, the second gate AND, the second prime ring counter, the fifth switch and the pulse generator being serially connected, the overflow output of the second prime ring counter being connected with an input of the second flip-flop and a negative input of the second gate AND, a second secondary ring counter counting up to [2(k+1)+1] and having an output connected to an input of the second flip-flop, and a second pulse repetition frequency doubling unit having an input connected to an output of the pulse generator and serially connected to the second secondary ring counter, wherein combined information inputs of the third operative memory unit and the second accumulating adder, a start input of the second pulse shape forming unit and a synchronization input of the pulse generator form an input of the decoder.

* * * * *